US008691612B2

(12) United States Patent
Kim et al.

(10) Patent No.: US 8,691,612 B2
(45) Date of Patent: Apr. 8, 2014

(54) METHOD OF CREATING MICRO-SCALE SILVER TELLURIDE GRAINS COVERED WITH BISMUTH NANOPARTICLES

(75) Inventors: Hyun-Jung Kim, Poquoson, VA (US); Sang Hyouk Choi, Poquoson, VA (US); Glen C. King, Williamsburg, VA (US); Yeonjoon Park, Yorktown, VA (US); Kunik Lee, Troy, MI (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 254 days.

(21) Appl. No.: 13/411,793

(22) Filed: Mar. 5, 2012

(65) Prior Publication Data
US 2012/0225513 A1  Sep. 6, 2012

Related U.S. Application Data

(60) Provisional application No. 61/448,748, filed on Mar. 3, 2011, provisional application No. 61/421,812, filed on Dec. 10, 2010.

(51) Int. Cl.
 *H01L 21/00* (2006.01)
(52) U.S. Cl.
 USPC ......... 438/54; 438/84; 438/95; 438/102; 438/478; 257/E21.09; 257/E21.459
(58) Field of Classification Search
 None
 See application file for complete search history.

(56) References Cited

U.S. PATENT DOCUMENTS 7,255,846 B2 * 8/2007 Ren et al. ............... 423/508

| | | | |
|---|---|---|---|
| 7,586,033 B2 * | 9/2009 | Ren et al. ............... 136/239 |
| 8,020,805 B2 | 9/2011 | Choi et al. |
| 8,083,986 B2 | 12/2011 | Choi et al. |
| 2008/0087314 A1 | 4/2008 | Xiao et al. |
| 2009/0072078 A1 | 3/2009 | Choi et al. |
| 2009/0185942 A1 | 7/2009 | Choi et al. |
| 2009/0203196 A1 | 8/2009 | Kim et al. |
| 2011/0117690 A1 | 5/2011 | Chu et al. |
| 2011/0192457 A1 * | 8/2011 | Nakayama et al. ........ 136/256 |

FOREIGN PATENT DOCUMENTS

WO  2011022189 A2  2/2011

OTHER PUBLICATIONS

Arun Majumdar, "Thermoelectricity in Semiconductor Nanostructures", Science 303, 777 (2004):DOI: 10.1126/science.1093164.

Dasaroyong Kim, Yeonseok Kim, Kyungwho Choi, Jaime C. Grunlan, and Choongho Yu, "Improved Thermoelectric Behavior of Nanotube-Filled Polymer Composites with Poly (3,4-ethylenedioxythiophene) Poly (styrenesulfonate)", ACSNANO, vol. 4, No. 1, 513-523, 2010.

D. A. Borca-Tascoic. G. Chen, A. Prieto, M. S. Martin-Gonzalez. A. Stacy et al., "Thermal properties of electrodeposited bismuth telluride nanowires embedded in amorphous alumina", Appl. Phys. Lett. 85, 6001 (2004); DOI: 10.1063/1.1834991.

(Continued)

*Primary Examiner* — Telly Green
*Assistant Examiner* — Khanh Duong
(74) *Attorney, Agent, or Firm* — Jennifer L. Riley; Thomas K. McBride

(57) ABSTRACT

Provided is a method of enhancing thermoelectric performance by surrounding crystalline semiconductors with nanoparticles by contacting a bismuth telluride material with a silver salt under a substantially inert atmosphere and a temperature approximately near the silver salt decomposition temperature; and recovering a metallic bismuth decorated material comprising silver telluride crystal grains.

20 Claims, 3 Drawing Sheets

(56) References Cited

OTHER PUBLICATIONS

Eugene Lee, Jae Ryu, Sriparna Bhattacharya and Terry Tritt, "Nanostructured Bulk Thermoelectric Materials and Their Properties", IEEE 2005 International Conference on Thermoelectrics.

Joshua D. Sugar, Douglas L. Medlin, "Precipitation of Ag2Te in the thermoelectric material AgSbTe2", Journal of Alloys and Compounds 478 (2009) 75-82.

T. Koga. T.C Harman, S. B. Cronin and M. S. Dresselhaus, "Mechanism of the enhanced thermoelectric power in (111)-oriented n-type PbTe/Pb1-xEuxTe multiple quantum wells", The American Physical Society, Physical Review B, vol. 60, No. 20, Nov. 15, 1999-II.

Kunio Ishida and Keiichiro Nasu. "Quantum pattern formation dynamics of photoinduced nucleation", The American Physical Society, Physical Review B, 77, 214303 (2008).

Junyou Yang, Rougang Chen, Xi'an Fan, Siqian Bao, and Wen Zhu, "Thermoelectric properties of silver-doped n-type Bi2Te3-based material prepared by mechanical alloying and subsequent hot pressing", Journal of Alloys and Compounds 407 (2006) 330-333.

Sang-Hyon Chu, Sang H. Choi, Jae-Woo Kim, Glen C. King, and James R. Elliott, "Ultrasonication of Bismuth Telluride Nanocrystals Fabricated by Solvothermal Method", Smart Structures and Materials 2006: Smart Electronics, MEMS, BioMEMS, and Nanotechnology edited by Vijay K. Varadan, Proc. of SPIE vol. 6172, 61720A, (2006).

Hyun-Jung Kim, Glen C. King, Yeonjoon Park, Kunik Lee and Sang H. Choi, "Thermoelectric Performance Enhancement by Surrounding Crystalline Semiconductors with Metallic Nanoparticles", The 9th International Energy Conversion Engineering Conference (IECEC); Jul.31-Aug. 3, 2011; San Diego, CA.

F.K. Aleskerov and S. Sh. Kakhramanov, "Interlayer Nanoparticles of Copper, Nickel, and Silver in Bi2Te3", Inorganic Materials, vol. 45, No. 9 2009.

\* cited by examiner

A cleavage surface SEM images ((a) and (b)) and TEM images ((c) and (d)) of the $Ag_2Te$-based Bi nanoparticles decorated sample. (e) EDS spectra of nanoparticle (as circled in (c))

METHOD OF CREATING MICRO-SCALE SILVER TELLURIDE GRAINS COVERED WITH BISMUTH NANOPARTICLES

CROSS-REFERENCE TO RELATED APPLICATIONS

This patent application is related to U.S. Provisional Patent Application No. 61/421,812. This patent application claims the benefit of U.S. Provisional Patent Application No. 61/448, 748, filed Mar. 3, 2011. Both applications are incorporated herein by reference thereto.

STATEMENT REGARDING FEDERALLY SPONSORED RESEARCH AND DEVELOPMENT

This invention was made in part by employees of the United States Government and may be manufactured and used by or for the Government of the United States of America for governmental purposes without the payment of any royalties thereon therefor.

BACKGROUND OF THE INVENTION

Thermoelectric (TE) materials have unique advantages in directly converting any level of thermal energy into electrical power and solid-state cooling by a reverse mode. Although thermoelectric devices are regarded advantageously with their high reliability, their lack of moving parts, and their ability to scale to any sizes; the devices energy conversion efficiency remains generally poor. To improve the TE performance, many approaches have been investigated over a half century. The efforts that have pushed the figure of merit (ZT) of TE materials up beyond 2 have been reported by several groups by employing low dimensional nanostructures, such as nanowires and nanoparticles. However, the TE performances reported by most of researches were based on those laboratory developed materials and test results. The device level performance of those TE materials reported has fallen short of the reported level of TE materials. Consequently, the performance of practical TE devices using those reported TE materials have rarely been better than the figure of merit 1 due to junction resistivity and an apparent mismatch of Seebeck, coefficients of TE and junction materials.

BRIEF SUMMARY OF THE INVENTION

Recently, many efforts have been made with new TE material designs that take advantage of the promising nanotechnology for enhancing the performance of TE. The performance of TE materials is determined by three major components: Seebeck coefficient, electrical conductivity, and thermal conductivity. The Seebeck coefficient is an intrinsic material property that is mainly determined by material morphology and impurity contents. Otherwise, electrical and thermal conductivities of TE material can be manipulated to enhance the TE performance. Within a crystalline structure the thermal transport property is dictated by phonon transmission rather than energetic electrons. Accordingly, by lowering phonon transmission through TE materials the thermal energy within the domain can be contained and used for harnessing electrons for conversion. Therefore, lowering thermal conductivity of TE materials is a key factor to enhance the performance of TE materials. The present invention improves the performance of TE materials. Moreover, raising the electrical conductivity while reducing thermal conductivity goes against each other. Normally, both properties undergo with the same trend. To break the trend, new material designs are necessary. Crystalline structure of TE materials is essential as a majority phonon carrier for thermal transport.

Accordingly, in at least one embodiment, the present invention provides a method of enhancing thermoelectric performance by surrounding crystalline semiconductors with metallic nanoparticles by contacting a bismuth telluride material with a silver salt under a substantially inert atmosphere and a temperature approximately near the silver salt decomposition temperature; and recovering a metallic bismuth decorated material comprising silver telluride crystal grains.

In another embodiment, the invention provides a method of surrounding crystalline semiconductors with metallic nanoparticles, by beginning with a step of substantially dry mixing a $Bi_2Te_3$ material having an average particle size less than about 100 μm, with a silver salt powder having a decomposition temperature greater than about 271° C., to form a mixture. Next, the mixture is heated under a substantially inert atmosphere and a temperature approximately near 300° C., and a metallic bismuth decorated material comprising $Ag_2Te$ crystal grains is recovered.

In yet another embodiment, the invention provides a method of enhancing thermoelectric performance by mixing a semiconductor material composed of $Bi_2Te_3$ having an average particle size less than about 100 μm, with a silver acetate hydrate powder, to form an acetic acid mixture, which is subject to a grinding step. Another step includes heating the acetic acid mixture under a substantially inert atmosphere and a temperature approximately near 300° C., wherein any oxygen generated is continuously removed. A further step includes recovering a metallic bismuth nanoparticle decorated material comprising $Ag_2Te$ crystal grains. Such bismuth nanoparticles are characterized as having a uniform particle distribution size range from about 50 to about 100 nm.

Additional objects, embodiments and details of this invention can be obtained from the following detailed description of the invention.

BRIEF DESCRIPTION OF THE SEVERAL VIEWS OF THE DRAWING(S)

DETAILED DESCRIPTION OF THE INVENTION

In general, the figure-of-merit for thermoelectric performance is described as follows: $ZT = S^2\sigma T/\kappa$, where S is the Seebeck coefficient, σ the electrical conductivity, and κ the thermal conductivity. As this equation indicates, the TE performance improves if the material intrinsically has higher Seebeck coefficient, higher electrical conductivity, and lower thermal conductivity.

Figure 1:
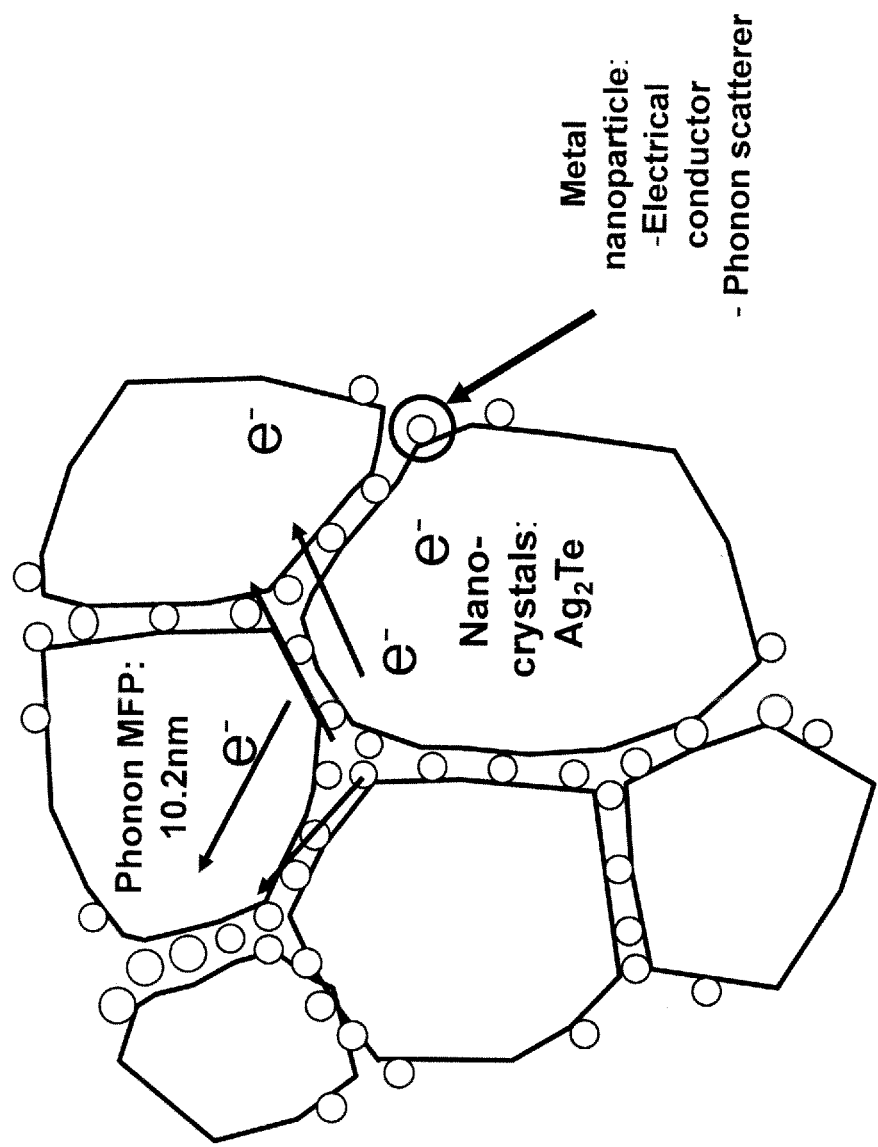
FIG. 1 shows a schematic for a new material design of thermoelectric crystalline semiconductors for controlling electron and phonon transports, wherein the grains shown in the figure indicate the formation of $Ag_2Te$ nano-crystals whose surfaces are covered with bismuth-rich nanoparticles.

In at least one embodiment, the invention includes a method of preparing a range of micro to nano-scale $Ag_2Te$ grains surrounded with bismuth-rich metallic nanoparticles as shown in FIG. 1. This type of morphological arrangement of $Ag_2Te$ grains covered with Bi metallic nanoparticles shows significant performance improvement by reducing its thermal conductivity from a grain to other grain through a separation gap which is greater than the phonon mean-free path. The separation gap is bridged by metallic bismuth nanoparticles that allow electrons pass through. The electrons passing through the metallic bridges sustain the level required for electrical conductivity of a TE material. The phonon which is a major thermal energy transport mechanism is scattered through the separation gap and the scattered phonon energy bumping through the separation gap is in transition to thermal energy that should be remained within the morphological domain of grain without conducting. The phonon transport through metallic bismuth nanoparticles are negligible since the boundaries of nanoparticle connecting from a grain to another grain also become phonon scattering interfaces. The energetic electrons that pass through the metallic bridges are the dominant thermal transport mechanism, but the ratio of thermal transport by energetic electrons is much less than 30% of total thermal energy within the given low temperature and morphological domain of grains. The rest is done by phonon transmission. Thus, aspects of the present invention include (1) the processing technique to prepare Silver Telluride (or called Telluric Silver) powders, coated with Bismuth-rich metallic nanoparticles, as well as (2) the idea of forming metallic nanoparticles bridges between the thermoelectric material grains to reduce thermal conductivity, while maintaining good electrical conductivity. In at least some aspects, the instant invention enables a new family of nanostructured bulk thermoelectric materials.

As background technology, workers at NASA Langley Research Center developed void generators (voigen) for nanovoids with a metal lining, which increased electrical conductivity while the nanovoids impeded phonon propagation by scattering and reduced thermal conductivity of TE materials. For example, see US Published Patent Application Nos. 2009/0072078 A1 and 2009/0185942 A1, which are incorporated herein by reference thereto.

Silver telluride is known to have good thermoelectric properties, with a known bulk thermoelectric figure-of-merit exceeding 1.0 at room temperature. We have developed a simple method to create micro-sized silver telluride grain powders surrounded by bismuth-rich metallic nanoparticles. A thermal process for alloy formation of $Ag_2Te$ was used with the mixture of bismuth telluride powders ($Bi_2Te_3$) and silver acetate ($CH_3COOAg$) powders. For example, during thermal loading, the chemical process for alloy formation can be described by the following reaction, when using a silver acetate hydrate powder and applying heat:

$$2Bi_2Te_3 + 12CH_3COOAg \cdot 6H_2O \rightarrow 6Ag2Te + 4Bi + 12CH_3COOH + 3O_2$$

Figure 2:
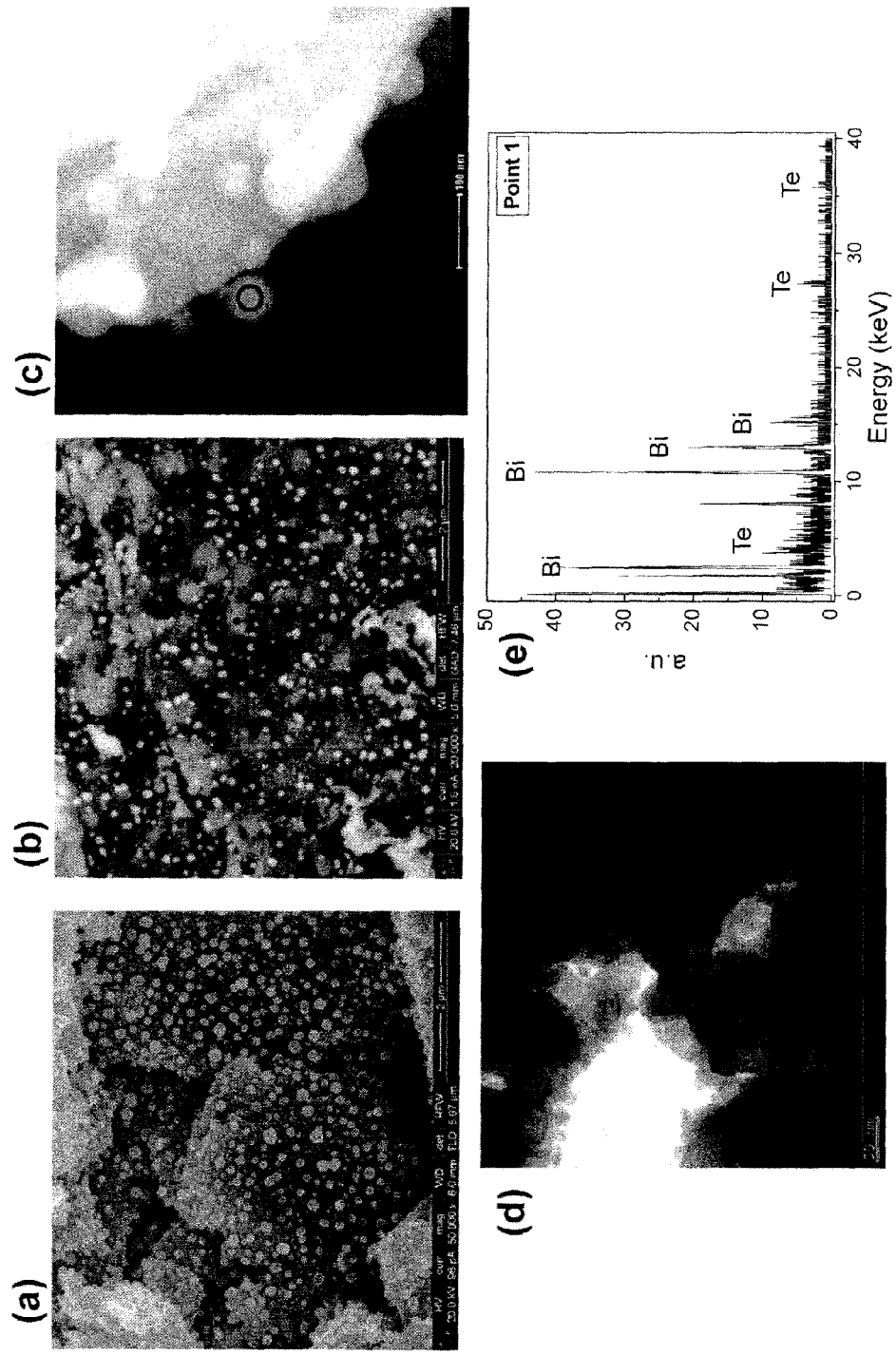
FIG. 2 (a) shows a cleavage surface SEM image of $Ag_2Te$ grain covered by bismuth metallic nanoparticles, (b) shows a backscattered electron SEM image, (c) shows a HAADF detector based S-TEM image, (d) shows a bright field TEM image, and (e) shows a EDS spectra of a nanoparticle circled in 2(c).

The mixture of two powders contains enough water molecules whose hydrogen replaces silver of silver acetate. The silver atoms replaced by hydrogen atoms form silver telluride molecules by tossing out bismuth atom from $Bi_2Te_3$. The tossed-out bismuth atoms aggregate together to form nano-sized particles while the acetic acid and oxygen are vaporized away at the reaction temperature. Interestingly, while the bismuth nanoparticles are developed, these bismuth nanopar-ticles position and anchor themselves over the surface of micro-sized silver telluride grains as shown in FIG. 2.

In many aspects of the invention, the methods to fabricate $Ag_2Te$ grain decorated with bismuth nanoparticles are uniquely stated by several notable advantages of being simple, rapid, and inexpensive. Also, the methods do not require any mandatory solution processes: they can often just use precursor silver acetate powder, or other types of silver salts that are similarly characterized with a thermal decomposition temperature at or around that needed to form the metallic bismuth particles. In at least some preferred embodiments, the silver salts have a decomposition temperature that exceeds about 271° C.

In some embodiments of the invention, the straightforward two-step process involves (1) dry mixing of precursor silver acetate with $Bi_2Te_3$ semiconductor particles, and followed by (2) heating in substantial inert (e.g. argon, nitrogen, or other mixture) atmosphere. It has been verified that this process has an excellent repeatability.

FIG. 1 illustrates an aggregated form of silver telluride crystals of which each crystal grain is surrounded by metallic bismuth nanoparticles. The bismuth nanoparticles connecting a silver telluride crystal grain to another neighboring grain play a role of bridge for facilitating electron transport from a crystal domain to another neighboring domain. The semiconductor crystals with a proper doping level still have abundant electrons available for conduction. At crystal boundaries, the electrons transport through metallic nanoparticles that are bridging gaps between crystals. $Bi_2Te_3$ has semiconductor characteristics, but its band-gap is very narrow (band-gap of around 0.25 eV (2003, Journal of Experimental and Theoretical Physics Letters 97, 1212)), which is often regarded as "bad metals". Further, metallic bismuth nanoparticles or the $Bi_{1-x}Te_x$, nanoparticles on $Ag_2Te$ crystal surfaces have an approximate Bi:Te stoichiometric ratio of about 9:1 or greater, which is regarded as a substantially Bi-rich phase. In this regard, all of these nanoparticles can be considered to have metallic characteristics-dominant properties. On the other hand, the domain boundaries of the nanocrystals are regarded as morphologically discontinuous and still scatter phonon transmission at their boundaries, regardless of a shorter mean free path of phonons. The metallic nanoparticle size and the uniform dispersion over the surface of bulk TE materials are important factors to determine the reduction level of thermal conductivity by setting up phonon bottlenecks between nanoparticles where phonon scatterings take place. This effect, when combined with the electron transport through the bridges of metallic (bismuth) nanoparticles, can lead to large enhancement in the energy conversion efficiency.

In at least one embodiment, the size of the bismuth nanoparticles can be controlled by grinding time and speed. Known methods of grinding include using ball mills, mortar and pestle, and other similar, conventionally understood techniques available to those of ordinary skill in the art.

The following examples further illustrate the invention but, of course, should not be construed as in any way limiting its scope.

Example

This example demonstrates an exemplary procedure for synthesizing $Ag_2Te$ crystal grains covered with Bi-rich metallic nanoparticles involving annealing a mixture of silver acetate ($CH_3COOAg$, 99%, supplied by Sigma-Aldrich) powder and $Bi_2Te_3$ ($Bi_2Te_3$, 99.98%, supplied by Alfa Aesar) powder in the inert (argon) atmosphere chamber approximately around the decomposition temperature of Ag salt. Two samples were prepared—the amount of silver acetate used to prepare the first and second samples were 30% and 50% of Bi2Te3 by weight, respectively. First, $Bi_2Te_3$ and silver acetate powders were ground manually at room temperature using a mortar and a pestle for 10-20 minutes. Acetic acid, vinegar-like, was generated during this process. The $CH_3COOAg/Bi_2Te_3$ powder mixture was then transferred to a quartz crucible and heated in an argon atmosphere chamber to 300° C. over 1 hour and kept at 300° C. isothermally for about 3 hours. Upon heating the silver acetate/$Bi_2Te_3$ mixture above the salt decomposition at a temperature of about 300° C. (Cf. 2009, ACS NANO 3, 871) in the chamber, the silver acetate was dissociated into silver and acetic acid by taking hydrogen. Here, the batch process temperature which was similar to the salt decomposition temperature, 300° C., which was higher than the melting point of Bi of $Bi_2Te_3$, i.e. about 271° C. Hence, the bismuth apparently melted out of $Bi_2Te_3$ and formed nano-sized metallic spheres, while the silver dissociated from silver acetate at 300° C. and replaced bismuth to form $Ag_2Te$ grains.

Through this process, it seems that silver substituted bismuth of the bismuth-telluride molecule. Through this substitution process, the melted bismuth was smeared out from the grain of $Bi_2Te_3$ and formed nanoparticles on the surface of the silver telluride crystals. This kind of synthetic process occurred at the nano-scale domain. The batch output product was then collected as a final form of silver telluride grains whose surfaces were covered with dangling bismuth nanoparticles.

For further characterization of $Ag_2Te$ crystal grain/Bi-rich nanoparticles, square-shaped pellets were prepared using a conventional, hot press method. The pellets composed of silver telluride grains decorated with Bi metallic nanoparticles were prepared under various metal loading levels, thermal treatment temperatures, and pressure levels. A sample used for thermoelectric characterization tests was prepared with 30% silver acetate by the weight of $Bi_2Te_3$ and was pressed at 5 metric ton at 200° C. to make the 1 by 1 $cm^2$ pellet. The pellets were sealed in a stainless steel mold and gradually heated to 200° C. After 1 hour, the mold was cooled slowly to the room temperature.

A cleavage surface scanning electron microscope (SEM) micrograph of the $Ag_2Te$ coated with bismuth metallic nanoparticles is shown in FIG. 2(a)&(b). As shown in these SEM images, the Bi metallic nanoparticles are uniformly distributed on $Ag_2Te$ grain surface. The sizes of Bi nanoparticles are fairly uniform (size ranges between about 50 to about 100 nm). To obtain high-resolution compositional maps of a sample and quickly distinguish different phases, we obtained the backscattered electrons (BSE) image (FIG. 2-(b)). Nanoparticles have brighter BSE intensities than other areas. A "brighter" BSE intensity correlates with greater average Z (Bi rich) in the sample, and "dark" areas have lower average Z. This result confirms to the atomic number contrast (Z-contrast) imaging using high-angle annular dark field (HAADF) detector (FIG. 3-(c)). A quantitative analysis of nano-particle from the energy dispersive (EDS) spectra confirmed an approximate stoichiometry ratio of Bi to Te of about at least 9:1 (i.e. Bi-rich phase) (FIG. 3-(e)). A high resolution transmission electron microscope (HRTEM) image of a nanoparticle (not shown) demonstrated that it had a face-centered cubic (FCC) structure (the zone axis of the Fast Fourier transform (ITT) image was [011]) and was single crystalline. The transmission electron microscope (TEM) Bright Field image on FIG. 3-(d) shows that $Ag_2Te$ grain powders are coated with bismuth-rich metallic nanoparticles, which are positioned as bridges between thermoelectric $Ag_2Te$ grains. Additional data, not shown, indicated $Ag_2Te$ formation in regard to charge transport properties and by observing a characteristic metal-to-semiconductor transition (around about 400° K).

Figure 3:
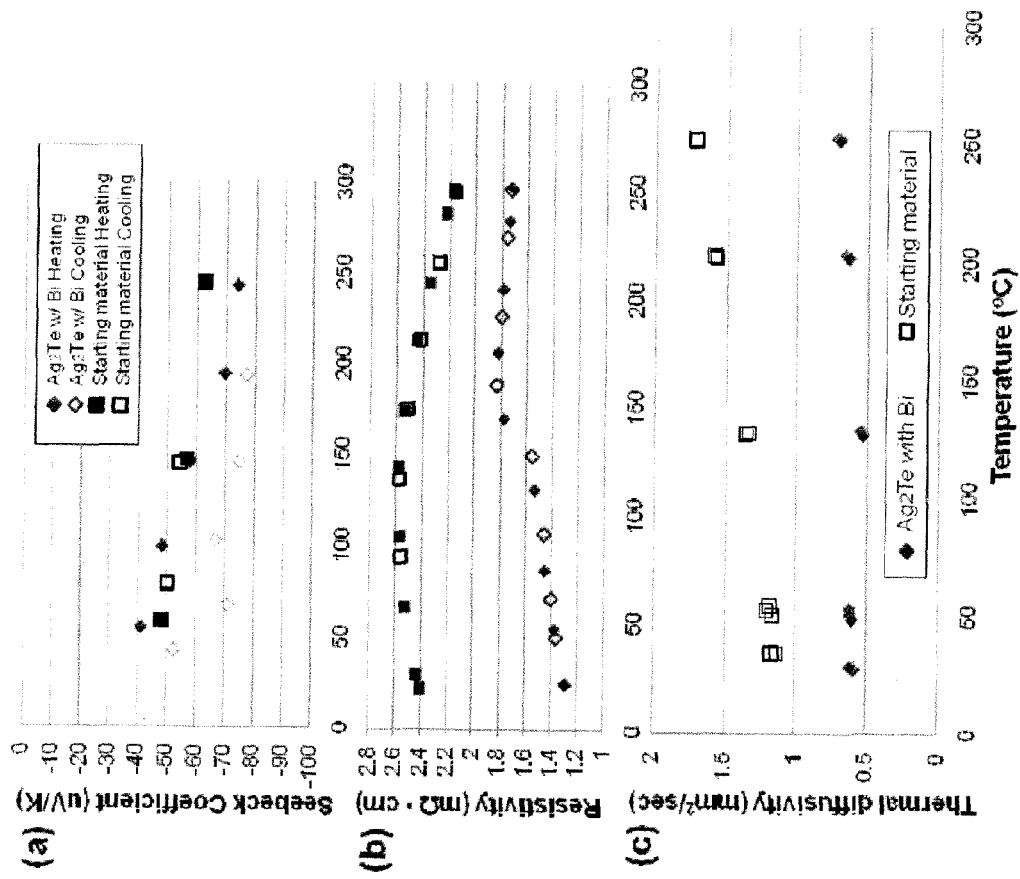
FIG. 3 shows temperature dependencies of (a) Seebeck coefficient, (b) electrical resistivity, and (c) thermal diffusivity of $Ag_2Te$ sample decorated with Bi-rich metallic nanoparticles and $Bi_2Te_3$ material itself.

Accordingly, methods of the instant invention were used to develop a materials processing technique to create the $Ag_2Te$ powders coated with bismuth-rich metallic nanoparticles, which demonstrated improved thermoelectric properties as summarized in FIG. 3, showing (a) the Seebeck coefficient, (b) the electrical resistivity, and (c) the thermal diffusivity of the samples. The Seebeck coefficient of $Ag_2Te$ grains covered with Bi metallic nanoparticles was increased compared to that of $Bi_2Te_3$ (starting material) (FIG. 3-(a)). It was considered that the thermal energy transmission from a grain to another through grain boundaries which are connected by the bridges of bismuth nanoparticles is dictated by the energetic electron and phonon transmission. The morphology of $Ag_2Te$ was generally crystalline and through it the phonon transmission was an overwhelming mechanism of energy transmission. In such a material the energy transmission by energetic electrons comprises of less than 30% of all. Accordingly, the bismuth bridges that connect $Ag_2Te$ grains tolerate electrons to pass through for maintaining a good electrical conductivity, but the phonon was scattered at both interfacing sides of the bismuth nanoparticle joining one grain to another of $Ag_2Te$. Also the amorphous structure of bismuth nanoparticles was not a good medium for effective phonon transmission. Considering these materials aspects of $Ag_2Te$ grain covered with bismuth nanoparticles, the inventive design for an advanced TE material developed here warrants the material properties with low thermal and high electrical conductivities which are very favorable for TE applications. Thus, the nanoparticle/matrix interface on grain geometry served as a thermal energy retarder for phonon while allowing electrons to move across the interfaces effectively. The thermal diffusivity is linearly related with the thermal conductivity. The test results show that the sample cake of $Ag_2Te$ grains covered with Bi-rich metallic nanoparticles has less than half of the thermal diffusivity of $Bi_2Te_3$ (FIG. 3-(c)). Further, despite the decrease in the thermal diffusivity, the electrical conductivity has been increased by twice (electrical resistivity decrease by twice) near the room temperature (FIG. 3-(b)).

The results suggest that the Bismuth metallic nanoparticles dangling on $Ag_2Te$ grain surface would play a major role in reducing the thermal conductivity, by promoting the phonon scatterings while enhancing the conduction of electrons. For the material model of $Ag_2Te$ grain covered by bismuth nanoparticles we have discovered and fabricated, the Seebeck coefficient was slightly lower than that of the $Bi_2Te_3$ sample at a low temperature up to 150° C. for a heating case as shown in FIG. 3(a). Otherwise, the test data for heating over 150° C. and cooling cases for the whole temperature range demonstrated higher Seebeck coefficients than that of $Bi_2Te_3$. However, the Seebeck coefficient of Ag2Te appears generally lower than expected. This could be attributed to various causes. It could be a problem of $Bi_2Te_3$ itself, which was used as a starting material. Seebeck coefficient of a pellet from the $Bi_2Te_3$ powder we have acquired and prepared with the method identical to the description above, was significantly low compared to those of the $Bi_2Te_3$ samples in general. However, after sieving and processing $Bi_2Te_3$ powders of size under 100 μm for new material design samples and conducting the identical experiment, Seebeck coefficient similar to that generally known for $Bi_2Te_3$ sample was obtained. From this, it has been verified that the size of the $Bi_2Te_3$ powder used as starting material determines the grain size of $Ag_2Te$ and plays a very important role for the current experiment.

Basically, nanometer-sized particles tend to aggregate due to large surface-to-volume ratio and high surface energy. In this regard, separation and uniform distribution of nanocrystal Bi—Te particles are one of the challenges in this work. It is expected that using smaller and uniformly sized $Bi_2Te_3$, a better figure of merit could be achieved.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of enhancing thermoelectric performance by surrounding crystalline semiconductors with metallic nanoparticles, said method comprising:
    (a) contacting a semiconductor material comprising a bismuth component and a telluride component with a silver salt under a substantially inert atmosphere and a temperature approximately near the silver salt decomposition temperature; and
    (b) recovering a metallic bismuth nanoparticle decorated material comprising silver telluride crystal grains.

2. The method of claim 1, wherein the silver salt comprises silver acetate.

3. The method of claim 1, wherein the substantially inert atmosphere comprises argon.

4. The method of claim 1, wherein the decomposition temperature is about 300° C.

5. The method of claim 1, wherein the semiconductor material comprises $Bi_2Te_3$.

6. The method of claim 5, wherein the silver salt is selected to have a decomposition temperature greater than about 271° C.

7. The method of claim 1, wherein the silver telluride crystal grains comprise $Ag_2Te$.

8. The method of claim 1, wherein the step of contacting further comprises a first step of substantially dry mixing to form a mixture, and a second step of heating the mixture.

9. The method of claim 8, wherein the step of substantially dry mixing further comprises a grinding step.

10. The method of claim 1, wherein the semiconductor material is characterized as having an average particle size less than about 100 µm.

11. The method of claim 10, wherein the metallic bismuth nanoparticles are characterized with a uniform particle distribution size range from about 50 to about 100 nm.

12. The method of claim 1, wherein the decorated material further comprises $Bi_2Te_3$.

13. A method of enhancing thermoelectric performance by surrounding crystalline semiconductors with metallic nanoparticles, said method comprising:
    (a) substantially dry mixing a semiconductor material comprising $Bi_2Te_3$ having an average particle size less than about 100 µm, with a silver salt powder having a decomposition temperature greater than about 271° C., to form a mixture;
    (b) heating the mixture under a substantially inert atmosphere and a temperature approximately near 300° C.; and
    (c) recovering a metallic bismuth nanoparticle decorated material comprising $Ag_2Te$ crystal grains.

14. The method of claim 13, wherein the silver salt comprises silver acetate.

15. The method claim 14, wherein the silver acetate comprises water hydrate, and wherein the step of substantially dry mixing generates acetic acid.

16. The method of claim 15, wherein the step of heating generates oxygen which is continuously swept from the mixture.

17. The method of claim 13, wherein the step of substantially dry mixing further comprises a grinding step.

18. The method of claim 13, wherein the metallic bismuth nanoparticles are characterized as having a uniform particle distribution size range from about 50 to about 100 nm.

19. A method of enhancing thermoelectric performance by surrounding crystalline semiconductors with metallic nanoparticles, said method comprising:
    (a) mixing a semiconductor material comprising $Bi_2Te_3$ having an average particle size less than about 100 µm, with a silver acetate hydrate powder, to form an acetic acid mixture;
    (b) grinding the acetic acid mixture;
    (c) heating the acetic acid mixture under a substantially inert atmosphere and a temperature approximately near 300° C., wherein any oxygen generated is continuously removed; and
    (d) recovering a metallic bismuth nanoparticle decorated material comprising $Ag_2Te$ crystal grains, wherein the metallic bismuth nanoparticles are characterized as having a uniform particle distribution size range from about 50 to about 100 nm.

20. The method of claim 19, wherein the decorated material further comprises $Bi_2Te_3$.

* * * * *